(12) United States Patent
Mathe

(10) Patent No.: US 7,898,453 B2
(45) Date of Patent: Mar. 1, 2011

(54) APPARATUS AND METHOD FOR SUCCESSIVE APPROXIMATION ANALOG-TO-DIGITAL CONVERSION

(75) Inventor: Lennart K. Mathe, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 31 days.

(21) Appl. No.: 12/329,450

(22) Filed: Dec. 5, 2008

(65) Prior Publication Data

US 2010/0141499 A1    Jun. 10, 2010

(51) Int. Cl.
*H03M 1/12* (2006.01)
(52) U.S. Cl. .................................. 341/172; 341/155
(58) Field of Classification Search .............. 341/155, 341/163, 144, 172, 122
See application file for complete search history.

(56) References Cited

U.S. PATENT DOCUMENTS

| | | | | |
|---|---|---|---|---|
| 4,908,624 | A * | 3/1990 | Goto et al. | 341/172 |
| 5,515,050 | A * | 5/1996 | Luedtke | 341/163 |
| 6,559,789 | B1 | 5/2003 | Somayajula | |
| 2006/0244647 | A1 | 11/2006 | Takano | |
| 2007/0139243 | A1* | 6/2007 | Chowdhury et al. | 341/155 |
| 2009/0273501 | A1* | 11/2009 | Madhavan et al. | 341/158 |

FOREIGN PATENT DOCUMENTS

| | | |
|---|---|---|
| EP | 1947769 A1 | 7/2008 |
| WO | WO 99037027 | 7/1999 |
| WO | WO 2008008271 | 1/2008 |

OTHER PUBLICATIONS

International Search Report - PCT/US09/066881 - International Search Authority, European Patent Office, Jun. 29, 2010.
Van Elzakker M. et al., "A 1.9µW 4.4fJ/Conversion-step 10b 1MS/s Charge-Redistribution ADC" Solid-State Circuits Conference, 2008. ISSCC 2008. Digest of Technical Papers. IEEE International, IEEE, Piscataway, NJ, USA, Feb. 3, 2008, pp. 244-610.

* cited by examiner

*Primary Examiner*—Peguy JeanPierre
(74) *Attorney, Agent, or Firm*—Jiayu Xu

(57) ABSTRACT

A successive approximation analog-to-digital converter (ADC) includes a binary-weighted capacitor array, quantizer, and control block. One end of each capacitor is connected to the input of the quantizer, and a second end of each capacitor is controlled by the control block through a driver. A voltage is sampled, quantized, and stored as the most significant bit of the ADC's output. Depending on the result of the quantization, the control block toggles the driver of one of the capacitors corresponding to the most significant bit. The voltage at the common node is sampled again to obtain a second bit of the ADC's output. The operations are repeated as needed to obtain and store additional bits of the ADC's output. Similar configuration and process are described for a differential ADC. The operation is asynchronous, allowing extra time for metastable states only when such states occur.

22 Claims, 8 Drawing Sheets

APPARATUS AND METHOD FOR SUCCESSIVE APPROXIMATION ANALOG-TO-DIGITAL CONVERSION

TECHNICAL FIELD

Apparatus and methods described in this document relate to electronic circuit designs. More specifically, the apparatus and methods relate to successive approximation analog-to-digital converters, comparators that may be used in such converters, methods for operating successive approximation analog-to-digital converters, and methods for operating comparators.

BACKGROUND

Successive approximation analog-to-digital converters (ADCs) convert a sampled level of a continuous or analog waveform into a digital representation through what is essentially a search of possible quantization levels, in order to converge on a digital value corresponding to conversion of the sampled level of the waveform. Successive approximation ADCs often employ switches to share charge between and among capacitors. ADCs are used in many circuits and systems, including, for example, sigma-delta modulators, which are typically present in wireless access terminals of cellular networks.

Progressively higher levels of system integration are desired in many electronic systems, including wireless access terminals, because integration offers lower production costs, allows more functions to be packed into smaller footprints and volumes, and improves performance as a result of increased speed and reduction in power consumption. Complimentary Metal-Oxide Semiconductor (CMOS) technology is currently widely used in making electronic devices. The need for high levels of integration is driving CMOS technology deeper into nanometer scale of fabrication. At this time, CMOS devices may be fabricated using 65 nm and even smaller feature-size devices. The scale of CMOS devices is likely to continue to decrease in the future. Unfortunately, good CMOS switches are not always readily available in deep submicron low-voltage fabrication processes.

Therefore, there is a need in the art to reduce the number of circuit-level CMOS switches in circuit designs, possibly replacing the circuit-level switches with inverters and logic gates. There is also a need in the art for increased operational speed of comparators, including comparators used in ADCs. There is a further need in the art for electronic devices, including wireless access terminals, employing the ADCs with reduced numbers of CMOS switches, and employing fast comparators.

SUMMARY

Embodiments disclosed herein may address one or more of the above stated needs by reducing the number of switches in ADCs, and by increasing operational speeds of quantizers through the use of asynchronous design state machine that controls ADC comparators. The asynchronous state machine waits for the metastable state of the comparator to resolve before moving on to the next comparator decision. In this way, no time in addition to the time required for the metastable state to resolve is wasted.

In an embodiment, an analog-to-digital converter includes a comparator with a comparator input and a comparator output, a control block with a control block input coupled to the comparator output, a plurality of pairs of capacitors, and a sampling switch. In the plurality of pairs of capacitors, capacitance values of the pairs of capacitors form a substantially binary progression, with substantially the same value for each pair. Each pair of capacitors of the plurality of pairs of capacitors includes a first capacitor and a second capacitor. The first end of each capacitor is coupled to the comparator input, while the second end of each capacitor is controlled by the control block. The sampling switch has a switch input configured to receive an input voltage, a switch output coupled to the comparator input, and a control switch input. The sampling switch is configured to be closed and transmit the input voltage to the switch output, or to be open and to isolate the input voltage from the switch output, depending on state of the control switch input. The control block is configured to provide an initial bias to the plurality of pairs of capacitors so that the second ends of the first capacitors are coupled to a first reference voltage, and the second ends of the second capacitors are coupled to a second reference voltage that is less than the first reference voltage. The control block is also configured to close and open the sampling switch to charge the first and second capacitors so that a voltage Vs at the comparator input is substantially equal to the input voltage at the time the sampling switch is opened. The control block is additionally configured to cause the comparator to compare the voltage Vs to a predetermined comparator threshold Vt to obtain a first bit of an output word corresponding to a digital representation of the voltage Vs. The control block is further configured to perform the following operations after obtaining the first bit, for each pair of capacitors in sequence of decreasing capacitance values: (1) if last obtained bit of the word indicated that the voltage Vs is greater than the predetermined comparator threshold Vt (Vs>Vt), toggle from a first reference voltage to a second reference voltage the second end of the first capacitor of each pair of capacitors in sequence, or, if the last obtained bit of the word indicated that Vt>Vs, toggle from the second reference voltage to the first reference voltage the second end of the second capacitor of each pair of capacitors in sequence, and (2) after toggling, compare the voltage Vs to the predetermined comparator threshold Vt to obtain a following bit of the word.

In an embodiment, a method of converting a voltage to a digital value includes a number of steps. The steps include providing a comparator with a comparator input and a comparator output. The steps also include providing a plurality of pairs of capacitors. Capacitance values of the pairs of capacitors form a substantially binary progression. Each pair of capacitors of the plurality of pairs of capacitors has a first capacitor and a second capacitor. Each capacitor of the plurality of pairs of capacitors has a first end coupled to the comparator input and a second end. The steps additionally include providing an initial bias to the plurality of pairs of capacitors so that the second ends of the first capacitors are coupled to a first reference voltage, and the second ends of the second capacitors are coupled to a second reference voltage, the second reference voltage being less than the first reference voltage. The steps further include closing and opening a sampling switch to charge the first and second capacitors so that a voltage Vs at the comparator input is substantially equal to input voltage at input of the sampling switch when the sampling switch is opened. The steps further include comparing the voltage Vs to a predetermined comparator threshold Vt to obtain a first bit of an output word corresponding to a digital representation of the voltage Vs. The steps further include, after obtaining the first bit, for each pair of capacitors in sequence of decreasing capacitance values, (1) if last obtained bit of the word indicated that the voltage Vs is greater than the predetermined comparator threshold Vt (Vs>Vt), toggling from a first reference voltage to a second reference voltage the second end of the first capacitor of each pair of capacitors in sequence, or, if the last obtained bit of the word indicated that Vt>Vs, toggling from the second reference voltage to the first reference voltage the second end of the second capacitor of each pair of capacitors in sequence; and (2) after toggling, comparing the voltage Vs to the predetermined comparator threshold Vt to obtain a following bit of the word.

In an embodiment, an analog-to-digital converter (ADC) includes a means for quantizing having an input and an output. The ADC also includes a means for controlling with an input coupled to the output of the means for quantizing. The ADC additionally includes a plurality of pairs of capacitors. Capacitance values of the pairs of capacitors form a substantially binary progression. Each pair of capacitors of the plurality of pairs of capacitors has a first capacitor and a second capacitor. Each capacitor of the plurality of pairs of capacitors has a first end coupled to the input of the means for quantizing and a second end. The ADC further includes a means for sampling having an input configured to receive an input voltage, an output coupled to the input of the means for quantizing, and a control input. The means for controlling is configured to:

(a) provide an initial bias to the plurality of pairs of capacitors so that the second ends of the first capacitors are coupled to a first reference voltage, and the second ends of the second capacitors are coupled to a second reference voltage, the second reference voltage being less than the first reference voltage, (b) operate the means for sampling to charge the first and second capacitors so that a voltage Vs at the means for quantizing input is substantially equal to the input voltage at the time the means for sampling output enters a high impedance state, (c) cause the means for quantizing to quantize the voltage Vs to obtain a first bit of an output word corresponding to a digital representation of the voltage Vs, (d) after obtaining the first bit, for each pair of capacitors in sequence of decreasing capacitance values, toggle from a first reference voltage to a second reference voltage the second end of the first capacitor of each pair of capacitors in sequence if last obtained bit of the word indicated that the voltage Vs is greater than a predetermined quantizer threshold Vt (Vs>Vt), or toggle from the second reference voltage to the first reference voltage the second end of the second capacitor of each pair of capacitors in sequence if the last obtained bit of the word indicated that Vt>Vs, and (e) after toggling, cause the means for quantizing to quantize the voltage Vs to obtain a following bit of the word.

In an embodiment, an analog-to-digital converter (ADC) includes a comparator with first and second comparator inputs and a comparator output. The ADC also includes a control block with a control block input coupled to the comparator output. The ADC additionally includes a plurality of sets of capacitors. Capacitance values of the sets of capacitors form a substantially binary progression. Each set of capacitors of the plurality of sets of capacitors has a first capacitor, a second capacitor, a third capacitor, and a fourth capacitor. Each first and second capacitor of the plurality of sets of capacitors has a first end coupled to the first comparator input and a second end. Each third and fourth capacitor of the plurality of sets of capacitors has a first end coupled to the second comparator input and a second end. The ADC further includes a sampling switch having switch inputs configured to receive an input voltage difference, switch outputs coupled to the first and second comparator inputs, and a control switch input. The sampling switch is configured to be closed and transmit the input voltage difference to the switch outputs, or to be open and to provide high impedances at the switch outputs, depending on state of the control switch input. The control block is configured to:

(a) provide an initial bias to the plurality of sets of capacitors so that the second ends of the first and fourth capacitors are coupled to a second reference voltage, and the second ends of the second and third capacitors are coupled to a first reference voltage, the second reference voltage being less than the first reference voltage, (b) close and open the sampling switch to charge the sets of capacitors so that a voltage difference Vs between the first and second comparator inputs is substantially equal to the input voltage difference at the time the sampling switch is opened, (c) compare the voltage difference Vs to a predetermined comparator threshold Vt to obtain a first bit of an output word corresponding to a digital representation of the voltage difference Vs, (d) after obtaining the first bit, for each set of capacitors in sequence of decreasing capacitance values, (1) toggle from a first reference voltage to a second reference voltage the second end of the second capacitor of each set of capacitors in sequence and toggle from the second reference voltage to the first reference voltage the second end of the fourth capacitor of each set of capacitors in sequence if last obtained bit of the word indicated that the voltage difference Vs is greater than the predetermined comparator threshold Vt (Vs>Vt), (2) toggle from the second reference voltage to the first reference voltage the second end of the first capacitor of each set of capacitors in sequence and toggle from the first reference voltage to the second reference voltage the second end of the third capacitor of each set of capacitors in sequence if the last obtained bit of the word indicated that Vt>Vs, and (e) after toggling, compare the voltage difference Vs to the predetermined comparator threshold to obtain a following bit of the word.

In an embodiment, a method of converting a voltage to a digital value includes providing a comparator having first and second comparator inputs and a comparator output. The method also includes providing a plurality of sets of capacitors. Capacitance values of the sets of capacitors form a substantially binary progression. Each set of capacitors of the plurality of sets of capacitors has a first capacitor, a second capacitor, a third capacitor, and a fourth capacitor. Each first and second capacitor of the plurality of sets of capacitors has a first end coupled to the first comparator input and a second end. Each third and fourth capacitor of the plurality of sets of capacitors has a first end coupled to the second comparator input and a second end. The method additionally includes providing an initial bias to the plurality of sets of capacitors so that the second ends of the first and fourth capacitors are coupled to a second reference voltage, and the second ends of the second and third capacitors are coupled to a first reference voltage, the second reference voltage being less than the first reference voltage. The method further includes closing and opening a sampling switch to charge the sets of capacitors so that a voltage difference Vs between the first and second comparator inputs is substantially equal to an input voltage difference at inputs of the sampling switch when the sampling switch is opened. The method further includes comparing the voltage difference Vs to a predetermined comparator threshold Vt to obtain a first bit of an output word corresponding to a digital representation of the voltage difference Vs. The method further includes, after obtaining the first bit, for each set of capacitors in sequence of decreasing capacitance values, toggling from a first reference voltage to a second reference voltage the second end of the second capacitor of each set of capacitors in sequence and toggling from the second reference voltage to the first reference voltage the second end of the fourth capacitor of each set of capacitors in sequence if last obtained bit of the word indicated that the voltage difference Vs is greater than the predetermined comparator threshold Vt (Vs>Vt), or toggling from the second reference voltage to the first reference voltage the second end of the first capacitor of each set of capacitors in sequence and toggling from the first reference voltage to the second reference voltage the second end of the third capacitor of each set of capacitors in sequence if the last obtained bit of the word indicated that Vt>Vs. The method further includes, after toggling, comparing the voltage difference Vs to the predetermined comparator threshold Vt to obtain a following bit of the word.

In an embodiment, an analog-to-digital converter (ADC) includes a means for quantizing a voltage having first and second quantizer inputs and a quantizer output. The ADC also includes a means for controlling having an input coupled to the quantizer output. The ADC additionally includes a plurality of sets of capacitors, capacitance values of the sets of capacitors forming a substantially binary progression. Each set of capacitors of the plurality of sets of capacitors has a first capacitor, a second capacitor, a third capacitor, and a fourth capacitor. Each first and second capacitor of the plurality of sets of capacitors has a first end coupled to the first quantizer input and a second end. Each third and fourth capacitor of the plurality of sets of capacitors has a first end coupled to the second quantizer input and a second end. The ADC further includes a means for sampling having inputs configured to receive an input voltage difference, outputs coupled to the first and second quantizer inputs, and a control input. The means for sampling is configured to be closed and transmit the input voltage difference to the means for sampling outputs, or to be open and to provide high impedances at the means for sampling outputs, depending on state of the control input. The means for controlling is configured to provide an initial bias to the plurality of sets of capacitors so that the second ends of the first and fourth capacitors are coupled to a second reference voltage, and the second ends of the second and third capacitors are coupled to a first reference voltage, the second reference voltage being less than the first reference voltage. The means for controlling is also configured to close and open the means for sampling to charge the sets of capacitors so that a voltage difference Vs between the first and second means for quantizing inputs is substantially equal to the input voltage difference at the time the means for sampling is opened. The means for controlling is additionally configured to cause the means for quantizing to quantize the voltage difference Vs to obtain a first bit of an output word corresponding to a digital representation of the voltage difference Vs. The means for controlling is further configured, after obtaining the first bit, for each set of capacitors in sequence of decreasing capacitance values, to toggle from a first reference voltage to a second reference voltage the second ends of the second and third capacitors of each set of capacitors in sequence if last obtained bit of the word indicated that the voltage difference Vs is greater than a predetermined quantizer threshold Vt (Vs>Vt), or to toggle from the second reference voltage to the first reference voltage the second ends of the second and third capacitors of each set of capacitors in sequence if the last obtained bit of the word indicated that Vt>Vs. The means for controlling is further configured, after toggling, to cause the means for quantizing to quantize the voltage difference Vs to obtain a following bit of the word.

In an embodiment, a method of converting a voltage to a digital value includes step for sampling the voltage to obtain a sampled voltage, and step for converting the sampled voltage to the digital value through successive approximation.

These and other embodiments and aspects of the present invention will be better understood with reference to the following description, drawings, and appended claims.

DETAILED DESCRIPTION

In this document, the words "embodiment," "variant," and similar expressions are used to refer to particular apparatus, process, or article of manufacture, and not necessarily to the same apparatus, process, or article of manufacture. Thus, "one embodiment" (or a similar expression) used in one place or context may refer to a particular apparatus, process, or article of manufacture; the same or a similar expression in a different place may refer to a different apparatus, process, or article of manufacture. The expression "alternative embodiment" and similar phrases may be used to indicate one of a number of different possible embodiments. The number of possible embodiments is not necessarily limited to two or any other quantity.

The word "exemplary" may be used herein to mean "serving as an example, instance, or illustration." Any embodiment or variant described herein as "exemplary" is not necessarily to be construed as preferred or advantageous over other embodiments or variants. All of the embodiments and variants described in this description are exemplary embodiments and variants provided to enable persons skilled in the art to make and use the invention, and not necessarily to limit the scope of legal protection afforded the invention.

"Top" and "bottom" are used herein to distinguish similar components appearing in the Figures. These are simply reference designations without substantive significance.

In a "binary" or "binary-weighted" capacitor array, a set of capacitors forms a binary sequence of values (e.g., 1, 2, 4, 8, etc.) and the capacitors are arranged in a voltage-divider configuration. A first end of each of the capacitors is connected to a common node, or a first common node, with each capacitor value corresponding to two capacitors. Each capacitor has a second end connected so that the voltage at the second end can be controlled. In a differential implementation, another set of such capacitors is similarly connected to a second common node. This concept is further illustrated in FIGS. 2 and 3D and the discussion relating to these Figures.

A "substantially" binary progression of values refers to an approximately binary sequence of values (as such sequence is described in the immediately preceding paragraph); the values may be binary, or approximately binary, for example, within a design tolerance limit of the capacitors, and/or within nearest standard value of a value needed for a strictly binary sequence. In variants, values of a substantially binary sequence may lie within ten percent of an ideal binary sequence.

Figure 1:
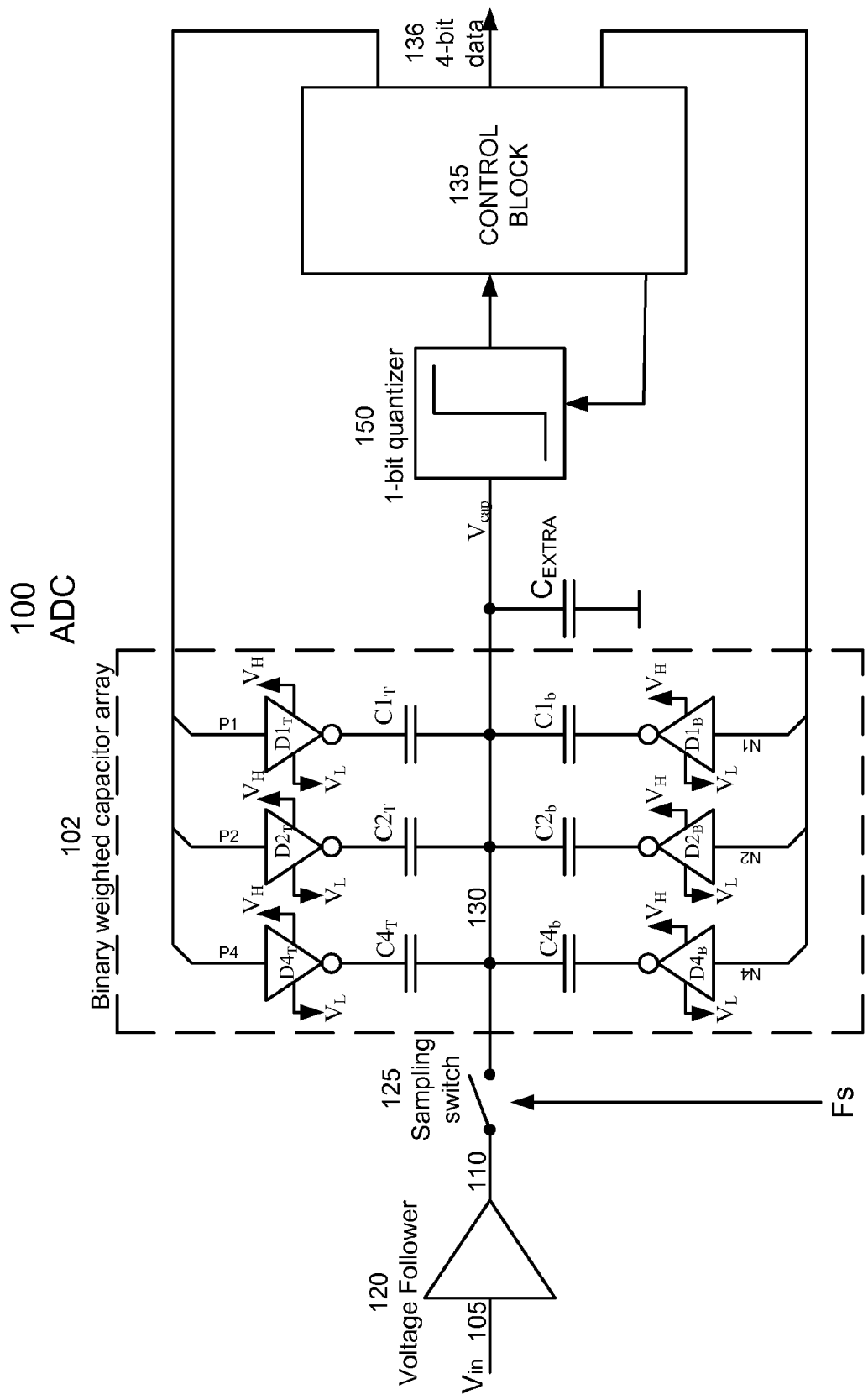
FIG. 1 illustrates selected elements of a successive approximation ADC.

FIG. 1 illustrates selected elements of a successive approximation ADC 100 that employs a binary-weighted array of capacitors 102 driven by inverters. The power supply voltages to these inverters, $V_H$ and $V_L$, may be chosen so that $V_H$ is close to or equal to the positive supply voltage $V_{DD}$ of the ADC 100, and $V_L$ is close to or equal to the negative supply voltage $V_{SS}$ of the ADC 100. The ADC 100 receives an input voltage $V_{in}$ at an input 105 of a voltage follower 120, and provides a digitized 4-bit representation of samples of the input voltage $V_{in}$ at an output 136 of an asynchronous control block 135.

The voltage follower 120 is optional, as are some of the other circuit elements shown and described. It is configured to isolate the input voltage from the rest of the circuitry of the ADC 100. The voltage follower 120 may receive the input voltage $V_{in}$ and provide at its output 110 a buffered and possibly otherwise conditioned version of the input voltage $V_{in}$; for example, the voltage follower 120 may provide buffering, true or substantially true voltage following, amplification, attenuation, voltage shifting, other kinds of voltage conditioning, or a combination of these functions.

A sampling switch 125 is configured to receive the version of the input voltage $V_{in}$ at the output of the voltage follower 120, and sample it periodically, for example, with a sampling frequency $F_s$. When the input voltage is sampled, a sample $V_s(t_n)$ of the voltage appears on a common node 130, charging the capacitors $C1_b$ through $C4_b$ and $C1_T$ through $C4_T$, each of which capacitors has one terminal coupled to the common node 130. Note that the capacitor subscripts "T" and "B" designate, respectively, one of the top capacitors or one of the bottom capacitors, as the capacitors appear in FIG. 1.

The sampling switch 125 may be implemented, for example, as part of the voltage follower 120 that configures the voltage follower 120 to assume a high-impedance output mode, or that shuts off the voltage follower 120. As another example, the sampling switch 120 may be implemented as a boosted N-channel Metal Oxide Semiconductor (NMOS) switch.

Here, the values of the capacitors $C1_b$ through $C4_b$ and $C1_T$ through $C4_T$ constitute a binary-weighted array, so that $C1_B \approx C1_T \approx C$ (a predetermined value),
$C2_B \approx C2_T \approx 2C$, and
$C4_B \approx C4_T \approx 4C$.

In other embodiments, other progressions may be used, and the respective bottom and top capacitors may vary in value.

The second terminal of each of the top capacitors $C1_T$-$C4_T$ is connected to an output of a corresponding driver $D1_T$-$D4_T$. Similarly, the second terminal of each of the bottom capacitors $C1_B$-$C4_B$ is connected to an output of a corresponding driver $D1_B$-$D4_B$. Although the drivers D are shown as inverters, they need not necessarily invert; for example, the drivers may be non-inverting drivers.

The input of each of the top and bottom drivers $D1_T$-$D4_T$ and $D1_B$-$D4_B$ is controlled by a control block 135, which may be an all-digital control block. The controlled block 135 is configured to set the output of each of the drivers $D1_T$-$D4_T$ and $D1_B$-$D4_B$ individually, either to a relatively high voltage $V_H$ or to a relatively low voltage $V_L$. Note that "relative" in the immediately preceding sentence means that $V_H > V_L$. For single-ended (non-differential) operation, $V_L$ may be the ground reference, and $V_H$ may be a regulated version of the supply voltage $V_{DD}$. The voltage $V_L$ may also be equal to $(-V_H)$, so that the center of the voltage range between $V_H$ and $V_L$ will be approximately zero. In variants, the voltages $V_L$ and $V_H$ are tightly controlled reference voltages, for example regulated or otherwise stable reference voltages. As noted above, $V_H$ may be close to or equal to the positive supply voltage $V_{DD}$ of the ADC 100, and $V_L$ may be close to or equal to the negative supply voltage $V_{SS}$ of the ADC 100.

The common node 130 is coupled to an input of a 1-bit quantizer 150, which may be simply a comparator configured to generate a one bit output depending on its input. The one bit output of the quantizer 150 may be set to trigger at the at the DC bias voltage of the input signal. Thus, if the input to the quantizer 150 exceeds the DC bias of the input signal, the output of the quantizer 150 may be a logic high; and if the input to the quantizer 150 is less than the DC bias of the input signal, the output of the quantizer 150 may be a logic low. As should be apparent to a person skilled in the art after perusal of this document, the logic values generated by the quantizer 150 may be reversed, depending on any additional processing and the particular digital representation selected for the output of the ADC 100.

The output of the quantizer 150 is coupled to the control block 135, where it may be internally latched (stored).

Initially (i.e., at the beginning of conversion), the control block 135 sets all of the top drivers ($D1_T$-$D4_T$) to output one of the reference voltages $V_H$ or $V_L$, and all of the bottom drivers ($D1_b$-$D4_b$) to output the second reference voltage $V_L$ or $V_H$. When the sampling switch 125 is closed, the capacitors $C1_T$-$C4_T$ and $C1_B$-$C4_B$ are charged so that $V_{cap}$ (the actual voltage on the common node 130 with respect to ground) is equal to the voltage $V_s$ at the output of the voltage follower 120, which may be the same or substantially the same as the input voltage $V_{in}$. When the sampling switch 125 is thereafter opened at a particular sampling time $t_n$, the voltage $V_{cap}$ remains substantially the same as $V_s(t_n)$, the voltage $V_s$ sampled at the time $t_n$, because the impedance at the common node 130 is high when the sampling switch 120 is open.

The quantizer (1-bit comparator) 150 is configured to quantize the $V_{cap}$ voltage when $V_{cap}$ is substantially the same as $V_s(t_n)$. The resulting output of the quantizer 150 corresponds to the most significant bit (MSB) of the digital representation of the voltage $V_s(t_n)$, which will be referred to as V[n]. The control block 135 internally latches (stores) the MSB of the V[n].

By selectively toggling the drivers D ($D1_T$-$D4_T$ and $D1_b$-$D4_b$) controlling the capacitor array ($C1_B$-$C4_B$ and $C1_T$-$C4_T$), the voltage $V_{cap}$ can be varied by predetermined amounts; the quantizer 150 can then successively quantize $V_{cap}$ and latch the results to obtain additional bits of the digital representation of the voltage $V_s(t_n)$. The control block 135 is configured to toggle the drivers D and latch the quantizer 150 output in order to obtain the remaining bits of V[n].

In the following paragraphs, we analyze variation in $V_{cap}$ due to toggling of the drivers after the sampling switch 125 is opened. The analysis is based on preservation of charge on the common node 130.

After the voltage Vs was sampled and the sampling switch 125 was opened, the control block 135 may continue to cause the top drivers $D1_T$-$D4_T$ to output $V_H$, and the bottom drivers $D1_B$-$D4_B$ to output $V_L$ (which polarities can be reversed).

Recall that the charge stored in a capacitor is a product of the potential difference across the capacitor and the capacitance: Q=VC. The charge stored in the bottom capacitors ($Q1_B$ through $Q4_B$ corresponding, respectively, to $C1_B$ through $C4_B$) can therefore be determined from the following equations:

$$Q1_B = (V_s(t_n) - V_L) \times C1_B;$$

$$Q2_B = (V_s(t_n) - V_L) \times C2_B; \text{ and}$$

$$Q4_B = (V_s(t_n) - V_L) \times C4_B.$$

Similarly, the charge stored in the top capacitors ($Q1_T$ through $Q4_T$ corresponding, respectively, to $C1_T$ through $C4_T$) can be determined as follows:

$$Q1_T = (V_H - V_s(t_n)) \times C1_T;$$

$$Q2_T = (V_H - V_s(t_n)) \times C2_T; \text{ and}$$

$$Q4_T = (V_H - V_s(t_n)) \times C4_T.$$

The charge $Q_{CM}$ on the common node 130 is the sum of the charges of the bottom capacitors less the sum of the charges of the top capacitors:

$$Q_{CM} = Q1_B + Q2_B + Q4_B - (Q1_T + Q2_T + Q4_T), \text{ or}$$

$$Q_{CM} = (V_s(t_n) - V_L) \times (C1_B + C2_B + C4_B) - (V_H - V_s(t_n)) \times (C1_T + C2_T + C4_T).$$

If the array is binary and $C1_B = C1_T = C$, $C2_B = C2_T = 2C$, and $C4_B = C4_T = 4C$, then the above equation takes on the following form:

$$Q_{CM} = ((V_s(t_n) - V_L) - (V_H - V_s(t_n))) \times 7C = (2V_s(t_n) - V_L - V_H) \times 7C.$$

Consider next the effect of toggling the output of one of the drivers on the voltage $V_{CAP}$. The corresponding capacitor, say $C1_B$, will then effectively switch from being a "bottom" capacitor to being a "top" capacitor. The total top capacitance (total capacitance between the common node 130 and $V_H$) will now be 8C (4C+2C+C+C), while the total bottom capacitance (between the common node 130 and $V_L$) will be 6C (4C+2C). Because the impedance at the common node 130 is high, the charge on the common node will remain the same as before toggling. The new $V_{cap}$, let us call it $V'_{cap}$, can now be derived from the equations that relate this voltage and the post-toggling capacitor charges (designated with primes to distinguish them from pre-toggling charges of the same capacitors). The first two equations show the new charges stored in the remaining bottom capacitors, and the new charges in the top capacitors (which now include an additional capacitor $C1_B$):

$$Q2'_B + Q4'_B = (V'_{cap} - V_L) \times (C2_B + C4_B) = (V'_{cap}) \times 6C - (V_L) \times 6C, \text{ and}$$

$$Q1'_T + Q2'_T + Q4'_T + Q1'_B = (V_H - V'_{cap}) \times (C1_T + C2_T + C4_T + C1_B) = (V_H - V'_{cap}) \times 8C.$$

Because $Q_{CM}$ remains unchanged and is the sum of the charges of the bottom capacitors less the sum of the top capacitors, we get the following expression:

$$(V'_{cap}) \times 6C - (V_L) \times 6C - (V_H - V'_{cap}) \times 8C = (2V_s(t_n) - V_L - V_H) \times 7C.$$

Rearranging the terms we can now obtain $V'_{cap}$:

$$V'_{cap} = V_s(t_n) + (V_H - V_L)/14.$$

Because $V_s(t_n)$ is $V_{cap}$ (before toggling), the increase in the voltage is simply one fourteenth of the difference between $V_H$ and $V_L$.

The equations above are all linear, so toggling the second end of $C1_T$ from $V_H$ to $V_L$ (instead of toggling the second end of $C1_B$ from $V_L$ to $V_H$) would result in a decrease in the voltage of the same magnitude. By the same reasoning, toggling $C2_B$ or $C2_T$ would result in an increase or a decrease of twice that determined above for $C1_B$ or $C1_T$, and toggling $C4_B$ or $C4_T$ would result in an increase or a decrease of four times that determined above for $C1_B$ or $C1_T$.

The capacitor $C_{extra}$ at the input of the quantizer 150 can be used to define and/or fine-tune the specific range of voltage values within which the comparisons are carried out; in effect, this capacitor can be used to change the value of the least significant bit of the ADC 100.

Figure 2:
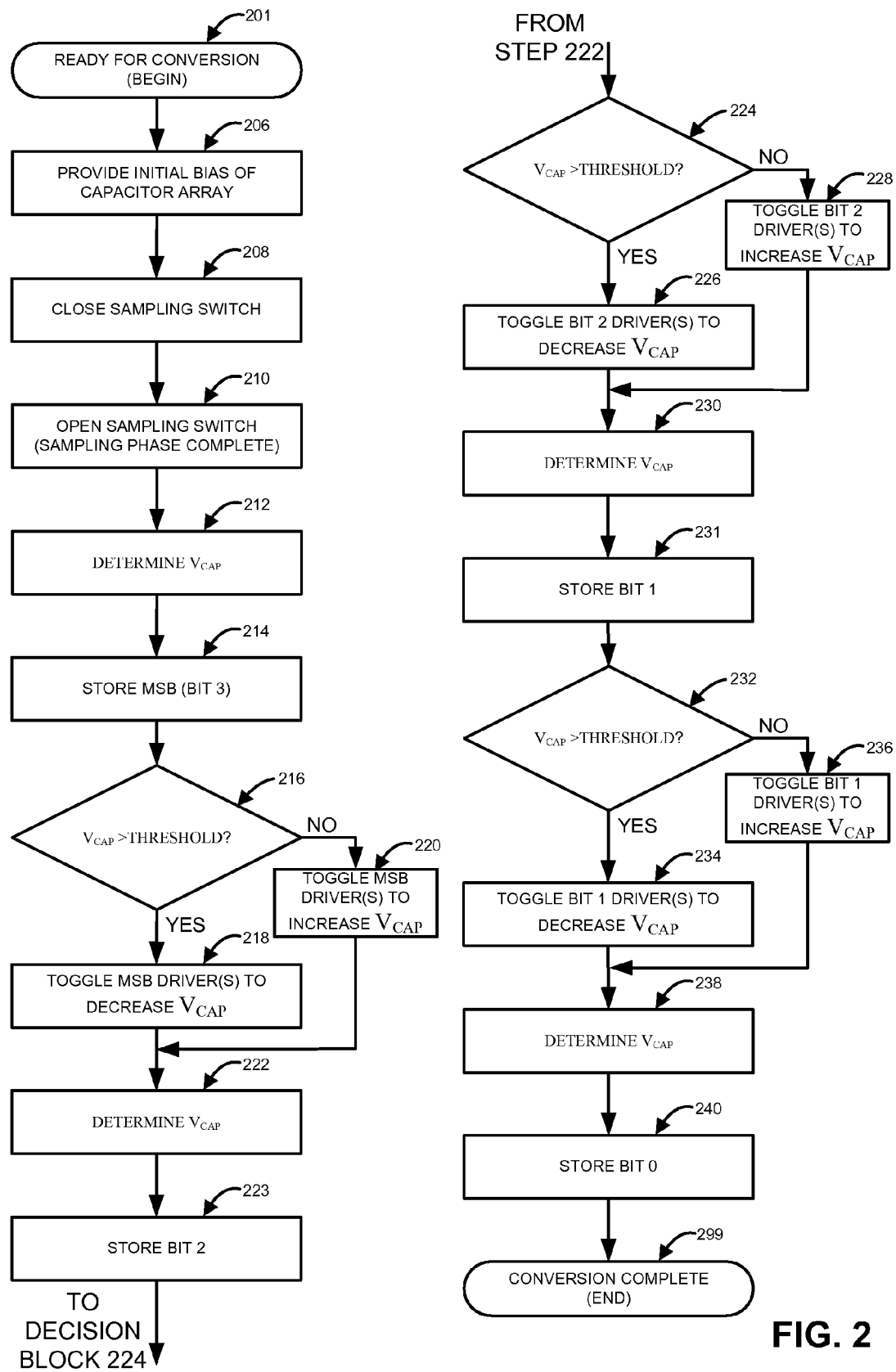
FIG. 2 illustrates selected steps and decision blocks of a successive approximation digital-to-analog conversion method.

FIG. 2 illustrates selected steps and decision blocks of a successive approximation digital-to-analog conversion method 200 performed by the ADC 100. At flow point 201, the ADC 100 is ready for conversion. The conversion includes two main phases: (1) a sampling phase, and (2) a conversion phase. Turning first to the sampling phase, in step 206, the control block 135 sets its control signals so that the inverters connected to one set of capacitors of the array (we will continue to assume these are the inverters connected to the top set, although the operation is symmetrical) output a high reference voltage ($V_H$), and the other set (bottom) of inverters connected to a second set of capacitors of the array output a low reference voltage ($V_L$). The sampling switch 125 is closed in step 208 and the voltage follower 120 charges the capacitors of the capacitor array 102 so that $V_s(t_n) = V_{cap}$.

In step 210, the sampling switch 125 is opened, completing the sampling phase.

In the conversion phase the following events take place. In step 212, the quantizer 150 determines if $V_{CAP}$ is greater or less than a threshold, for example, the DC bias of the input signal; in this example we will assume that $V_H = -V_L$, so that the interval is centered at zero. As previously mentioned, the output of the quantizer 150 at this time is the MSB (bit 3) of the output word V[n]. The control block 135 latches (stores) the MSB, in step 214.

In decision block 216, the ADC 100 branches to step 218 if $V_{CAP}$ is greater than the threshold, and the control block 135 toggles the top inverter $D4_T$ output from high to low. Conversely, if $V_{CAP}$ is less than the threshold, the ADC 100 branches to step 220 and the control block 135 toggles the bottom inverter $D4_B$ output from low to high. As demonstrated above, this should decrease or increase the $V_{CAP}$ voltage by 2/7 of the difference between $V_H$ and $V_L$ ($V_H - V_L$). The $D4_T$ and $D4_B$ inverters remain unchanged during the remainder of the conversion phase.

Next, the operations are repeated for the C2 capacitors and D2 inverters. That is, the quantizer 150 again determines if the voltage at its input ($V_{CAP}$) is greater or less than the threshold, in step 222. The output of the quantizer 150 at this time is the next bit (bit 2) of the output word V[n]. The control block 135 stores this bit, in step 223. If $V_{CAP}$ is greater than the threshold, as determined in decision block 224, then the control block 135 toggles the top inverter $D2_T$ output from high to low, in step 226. Conversely, if $V_{CAP}$ is less than the threshold, then the control block 135 toggles the bottom inverter $D2_B$ output from low to high, in step 228. This should decrease or increase the $V_{CAP}$ voltage by 1/7 of ($V_H - V_L$). The $D2_T$ and $D2_B$ inverters remain unchanged during the remainder of the conversion phase.

The operations are again repeated for the C1 capacitors and D1 inverters. The quantizer 150 determines if $V_{CAP}$ is greater or less than zero, in step 230. The output of the quantizer 150 at this time is the next bit (bit 1) of the output word. The control block 135 stores this bit, in step 231. If $V_{CAP}$ is greater than zero, as determined in decision block 232, then the control block 135 toggles the top inverter $D1_T$ output from high to low, in step 234. Conversely, if $V_{CAP}$ is less than zero, then the control block 135 toggles the bottom inverter $D1_B$ output from low to high, in step 236. This should decrease or increase the $V_{CAP}$ voltage by $\frac{1}{14}$ of $(V_H-V_L)$. The $D2_T$ and $D2_B$ inverters remain unchanged during the remainder of the conversion phase.

In step 238, the quantizer 150 determines if $V_{CAP}$ is greater or less than zero once more. The output of the quantizer 150 at this time is the least significant bit (bit 0, LSB) of the output word V[n]. The control block 135 stores the LSB, in step 240. The conversion phase is now complete with four bits <3-0> of the digital representation of the sampled voltage latched in the control block 135, and the process terminates at flow point 299. Note that in typical operation the method 200 would be repeated as the need to convert a voltage into digital form arises.

The simplified design shown in FIG. 1 may be a single-ended version of a 4-bit ADC. It is shown as a single-ended device for simplicity, but would typically be implemented as a differential circuit having two capacitor arrays. The design can be naturally extended to a 5-bit design by adding another ("8") set of capacitors to the capacitor array, and corresponding inverters/drivers; and in similar way the design can be extended further to obtain still higher resolutions of the ADC. Of course, the design can also be truncated to 3 or 2 bits by removing the "4" or/and "2" sets of capacitors and their corresponding inverters/drivers.

Figure 3A:
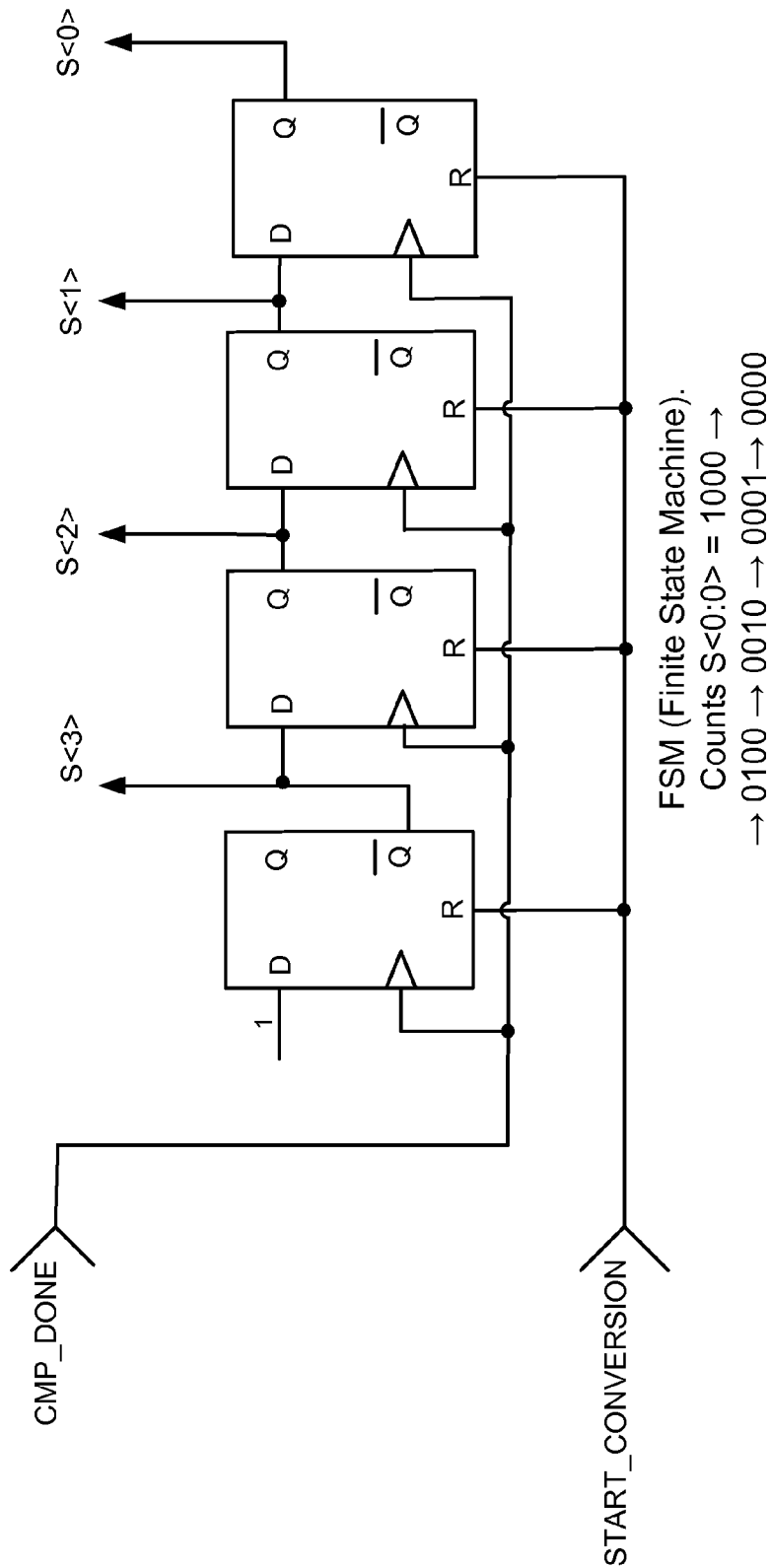
FIG. 3A illustrates selected elements of a finite state machine of a differential successive approximation ADC.
Figure 3B:
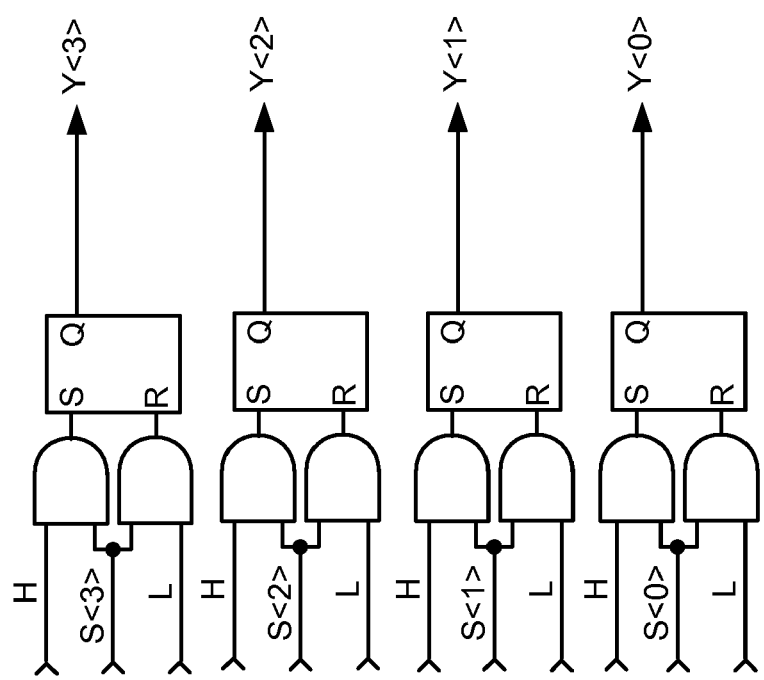
FIG. 3B illustrates selected elements of an output generator circuit of the differential successive approximation ADC.
Figure 3C:
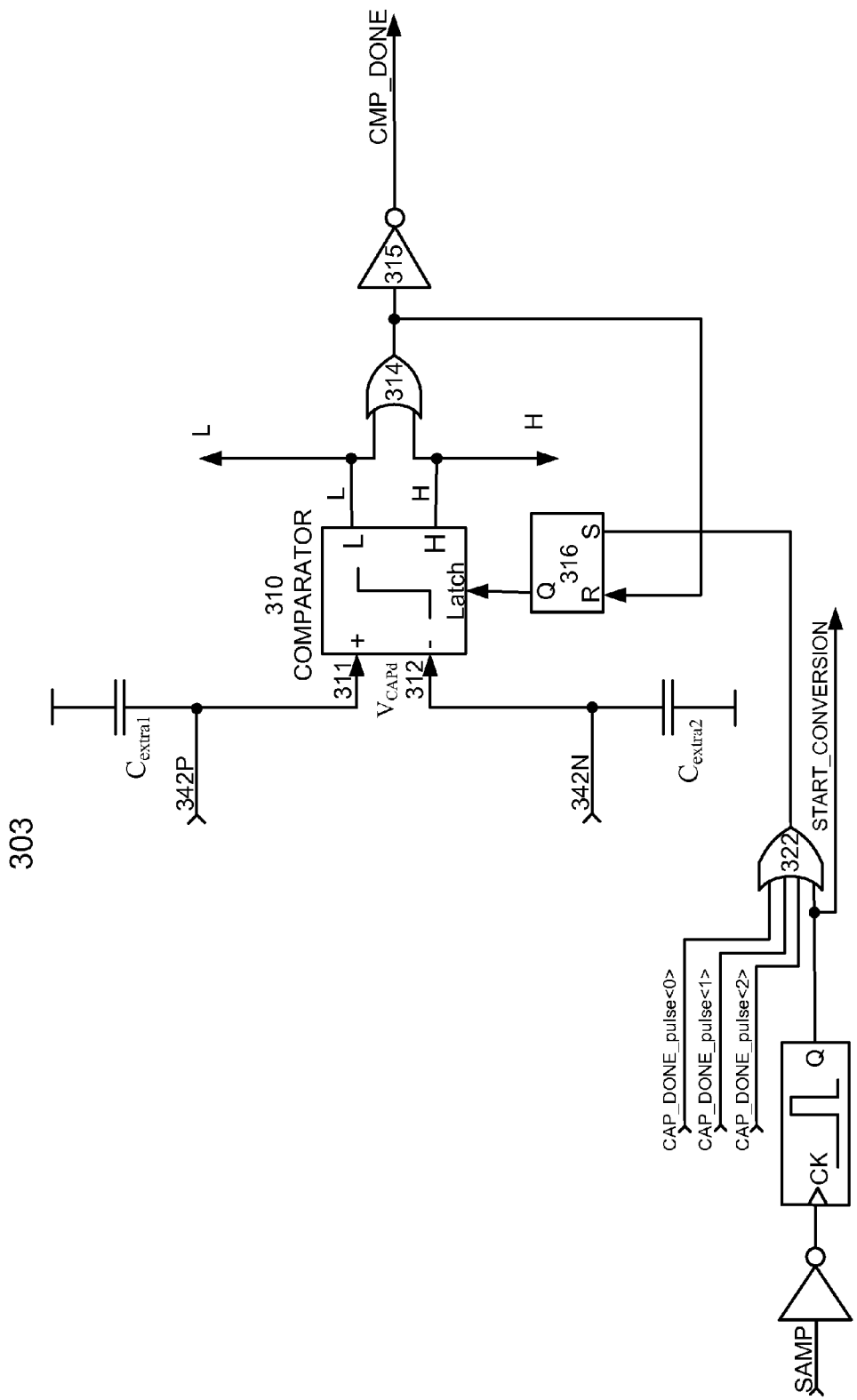
FIG. 3C illustrates selected elements of a quantizer circuit of the differential successive approximation ADC.
Figure 3D:
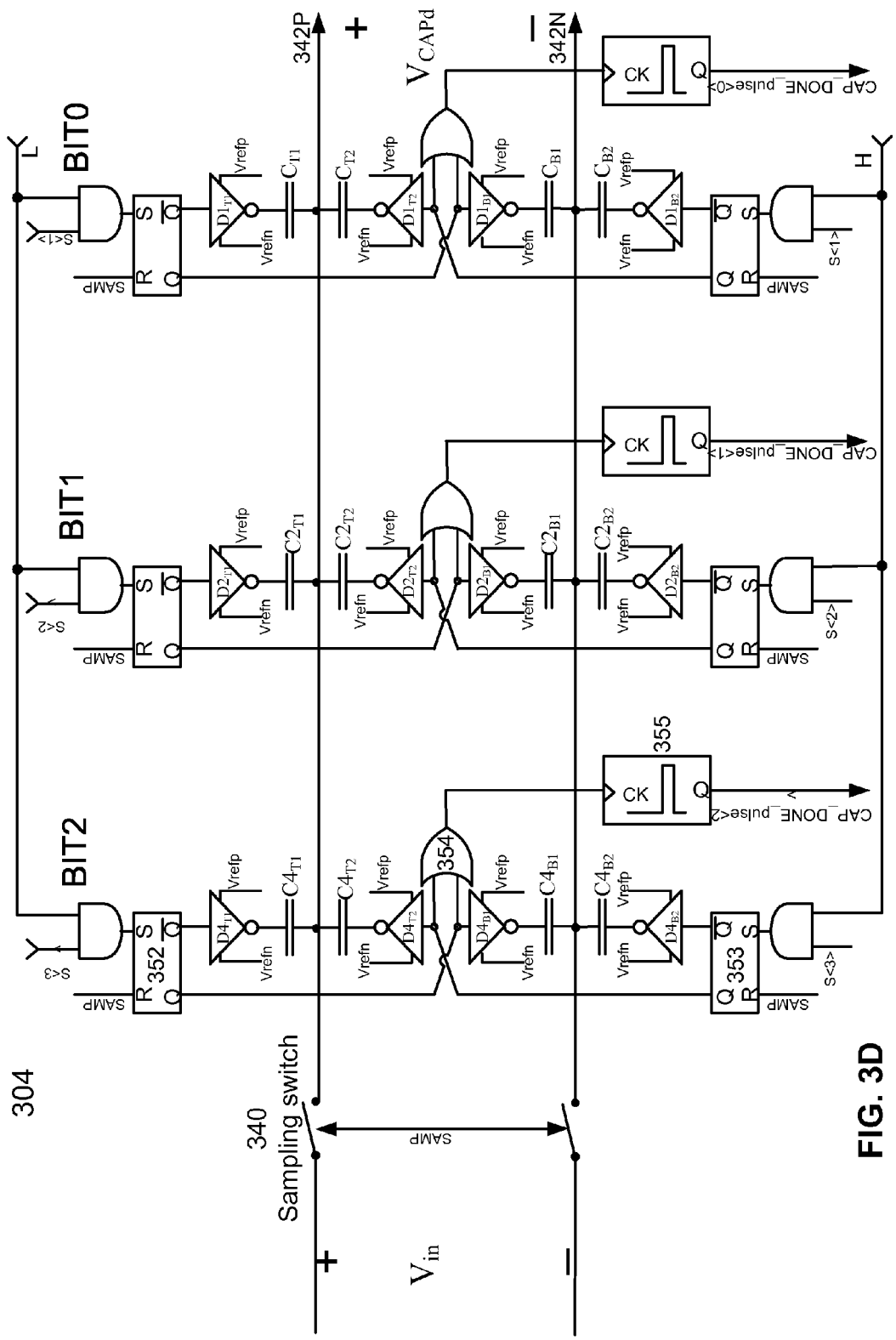
FIG. 3D illustrates selected elements of additional circuitry of the differential successive approximation ADC, including a capacitor array and drivers controlling the array.

FIGS. 3A, 3B, 3C, and 3D illustrate selected elements of an ADC analogous to the ADC 100, but configured for differential operation. FIG. 3A shows selected elements of a finite state machine (FSM) 301; FIG. 3B illustrates selected elements of an output generator circuit 302; FIG. 3C illustrates selected elements of a 1-bit differential quantizer circuit 303; and FIG. 3D illustrates selected elements of circuitry 304 that includes a differential sampling switch, a differential capacitor array, and drivers/inverters for the differential capacitor array with associated control elements.

The finite state machine 301 of this embodiment includes four D flip-flops arranged as shown. The output Q of each D flip-flop is set low regardless of clock and D input if the R (reset) input is high. If the R input is low and the clock input makes a transition from low to high, then the output Q takes the value of the input D at the time of the clock transition. The output Q then keeps this value until the next clock transition from low to high. The state machine outputs bits S<0> through S<3> following a pulse on a START_CONVERSION input. The states progression of S<3:0> here is 1000->0100->0010->0001->0000. The signal at an input CMP_DONE (indicating that the comparator has generated a valid comparison result) triggers each transition of the FSM 301. Note that the particular state progression is not necessarily a requirement of every embodiment.

The output generator circuit 302 is configured to receive H (high) and L (low) comparator outputs (as will be discussed below), and to latch them in appropriate locations for outputting the digital result of the analog-to-digital conversion. The latching is controlled by the S<3:0> states generated by the FSM 301. Here, the output generator circuit 302 includes AND gates and SR latches, arranged as shown.

The quantizer circuit 303 includes a comparator 310, an SR latch 316, an OR gate 314, and capacitors $C_{extra1}$ and $C_{extra2}$ at inputs 311 and 312 of the comparator 310.

The differential voltage $V_{CAPd}$ (differential analogue of $V_{CAP}$ of the ADC 100, i.e., the voltage that is being compared/quantized by the comparator) is coupled to the inputs 311 and 312 of the comparator 310. The comparator 310 may be a latched CMOS comparator that functions as follows. When the input signal "latch" is low, the comparator 310 is in a reset mode and both its outputs are forced low (de-asserted). When the signal "latch" is high, the comparator 310 determines if the input voltage $V_{CAPd}$ is greater or less than a predetermined threshold, usually zero. If $V_{CAPd}$ is greater than the threshold, the signal H transitions to high (asserted) while L remains low (de-asserted). If $V_{CAPd}$ is less than the threshold, the signal L transitions high while H remains low. In the case when the input signal is approximately equal to the threshold, the comparator may enter a so-called metastable state, in which neither H nor L may be set. The comparator 310 exits the metastable state after some short period of time and at that time either H or L will transition high (depending on the decision made by the comparator), and the other output will remain low.

Note that the "latch" signal is generated by the Q output of the SR latch 316, so that the outputs H and L are latched (i.e., the comparison is made) on the rising edge of the Q output of the flip-flop 316. The SR latch 316 (as well as other SR latches described in this document) is in the set mode when the input S (set) is high and the input R (reset) is low; then the output Q of the SR latch is set high. When the input S of the SR latch is high and the input R is low, the SR latch is in the reset mode and the Q output of the SR latch is set low. In the memory mode both inputs S and R are low, and the Q output of the SR latch keeps the last value. As in the case of other gates, flip-flops, and similar devices, the Q-bar ($\overline{Q}$) output is equal to the inverse of the Q output.

FIG. 3C shows that the CMP_DONE signal is generated at the output of the OR gate 314, which receives at its inputs the H and L outputs of the comparator 310. The CMP_DONE signal is de-asserted (low) when both H and L are low. In this way, CMP_DONE functions, as its name implies, as an indicator of when the H and L outputs are valid and the comparator 310 is not in the metastable state. The use of CMP_DONE allows the ADC to make sure that enough time delay is available when the comparator 310 is in fact in the metastable state, and at the same time the ADC need not be slowed down so that this same long time delay is inserted for each comparison; additional time for each comparison is used in response to the actual presence of the metastable state, but not otherwise. The operation of the ADC is thus asynchronous and its speed is increased.

The capacitors $C_{extra1}$ and $C_{extra2}$ at the inputs 311 and 312 of the comparator 310 can be used to define and/or fine-tune the specific range of voltage values within which the comparisons are carried out; in effect, these capacitors can be used to change the value of the least significant bit of the ADC.

The differential sampling switch 340 of the circuitry 304 shown in FIG. 3D may be a differential equivalent of the single-ended sampling switch 125 of FIG. 1. The switch 340 is configured to receive the version of the input voltage $V_{in}$ at the input to the ADC, and sample it periodically, for example, at a sampling frequency $F_s$. Because the circuit is differential, the sampling switch 340 may be implemented, for example, as part of the voltage follower that drives $V_{in}$, in which case the voltage follower may be configured to assume a high-impedance output mode, or to be shut off when the sampling switch 340 needs to be opened. Similarly, the sampling switch 340 may be implemented as a pair of boosted NMOS switches.

In the sampling phase the differential sampling switch 340 is closed, and the $V_{in}$ voltage at the output of the switch 340 charges the top and bottom capacitors $C_{T1}$, $C_{T2}$, $C_{B1}$, $C_{B2}$, $C2_{T1}$, $C2_{T2}$, $C2_{B1}$, $C2_{B2}$, $C4_{T1}$, $C4_{T2}$, $C4_{B1}$, and $C4_{B2}$. All the SR latches shown in FIG. 3D are reset. At the end of the sampling phase, the switch is opened.

The capacitors $C_{T1}$, $C_{T2}$, $C_{B1}$, $C_{B2}$, $C2_{T1}$, $C2_{T2}$, $C2_{B1}$, $C2_{B2}$, $C4_{T1}$, $C4_{T2}$, $C4_{B1}$, and $C4_{B2}$ form what we can call a differential capacitor array. The capacitors may form a differential binary array, where:

$C_{B1} \approx C_{T1} \approx C_{B2} \approx C_{T2} \approx C$,
$C2_{B1} \approx C2_{T1} \approx C2_{B2} \approx C2_{T2} \approx 2C$, and
$C4_{B1} \approx C4_{T1} \approx C4_{B2} \approx C4_{T2} \approx 4C$.

One side of each of these capacitors is connected either to the positive input differential node 342P or the negative common differential node 342N, as shown. The other side of each capacitor is connected to output of a corresponding driver selected from $D1_{T1}$-$D4_{T1}$, $D1_{T2}$-$D4_{T2}$, $D1_{B1}$-$D4_{B1}$, and $D1_{B2}$-$D4_{B2}$, as also is shown in FIG. 3D. Although the drivers D are shown as inverters, they need not necessarily invert; for example, the drivers may be non-inverting drivers.

The input of each of the drivers $D1_{T1}$-$D4_{T1}$, $D1_{T2}$-$D4_{T2}$, $D1_{B1}$-$D4_{B1}$, and $D1_{B2}$-$D4_{B2}$ is controlled by other devices appearing in FIGS. 3A-3D. The drivers also receive the relatively high reference voltage $V_{REFP}$ and the relatively low reference voltage $V_{REFN}$. Note that "relative" in the immediately preceding sentence means that $V_{REFP} > V_{REFN}$. In variants, the voltages $V_{REFN}$ and $V_{REFP}$ are tightly controlled reference voltages, for example regulated or otherwise stabilized reference voltages. The voltage $V_{REFN}$ may be equal to ($-V_{REFP}$). Therefore, depending on the input of each inverter, the output of the same inverter is driven either to $V_{REFN}$ or $V_{REFP}$. Consequently, the second side of each of the capacitors in the differential capacitor array is also driven either to $V_{REFN}$ or $V_{REFP}$. $V_{REFP}$ may be chosen at or near the positive supply voltage $V_{DD}$, while $V_{REFN}$ may be chosen at or near the negative supply voltage (or ground) $V_{SS}$.

The common differential nodes 342P and 342N are coupled, respectively, to the inputs 311 and 312 of the 1-bit quantizer 303. The H and L outputs of the quantizer 303 may be set to trigger at the middle of the range defined by the voltages $V_{REFP}$ and $V_{REFN}$, which typically is 0 ($V_{REFN} = -V_{REFP}$).

Conversion phase begins after the sampling phase, that is, after the differential sampling switch 340 is opened. As shown in FIGS. 3, the sampling phase corresponds to the SAMP signal being high, and the conversion phase corresponds to the SAMP signal being low.

In the conversion phase, the following events take place.

The transition of the SAMP signal from high to low creates a pulse of the START_CONVERSION signal, which resets the FSM 301 so that its output is "1000." The START_CONVERSION pulse also sets the SR latch 316 that controls the comparator 310, through an OR gate 322. This causes the comparator 310 to set one of its outputs H or L, depending on the voltage $V_{CAPd}$. The output bit Y<3> is then set high or low, again, depending on the voltage $V_{CAPd}$.

If the output L was set (meaning that the comparator 310 input voltage was less than a predetermined threshold, for example, zero), then the upper SR latch 352 (FIG. 3D) in the bit "2" circuit is set, causing the voltage of the positive input differential node 342P to be increased by $4C/(4C+2C+2C+1C+1C+C_{EXTRA})*(V_{REFP}-V_{REFN}) = 4C/(10C+C_{EXTRA})*(V_{REFP}-V_{REFN})$ volt. (This is analogous to the increase in the voltage of the common node 130, and further accounting for $C_{EXTRA}$.) The voltage at the negative input differential node 342N is decreased by the same amount. (The analysis is analogous to that set forth above for the common node 130, and also accounting for the presence of $C_{EXTRA1}$ and $C_{EXTRA2}$ capacitors, each having a capacitance of $C_{EXTRA}$). In this way the voltage $V_{CAPd}$ is increased by an amount $4C/(5C+C_{EXTRA})*(V_{REFP}-V_{REFN})$.

On the other hand, if signal H was set (meaning that the comparator input voltage was more than the predetermined threshold), then the lower SR latch 353 in the bit "2" circuit is set, causing the voltage $V_{CAPd}$ to be decreased by $4C/(5C+C_{EXTRA})*(V_{REFP}-V_{REFN})$.

Because either the H or L output of the comparator 310 went high, the CMP_DONE signal at the output of the OR gate 314 will become asserted, resetting the SR latch 316. The SR latch 316 controls the comparator 310, thus bringing the comparator 310 back to the reset mode and forcing both H and L outputs low.

The CMP_DONE signal is connected to the clock inputs of the D flip-flops of the FSM 301. Therefore, the assertion of the CMP_DONE will also advance the FSM 301 to the next state, which here is "0100." It should be noted that the specific states and their progressions may vary in embodiments.

Once one of the SR latches 352 or 353 in the bit "2" circuit is set, an OR gate 354 and a one-shot 355 generate a pulse of the CAP_DONE_pulse<2> signal. This pulse acts through the OR gate 322 (FIG. 3C) to set the SR latch 316 that controls the comparator 310, causing the comparator 310 to set one of its outputs H or L, depending on the voltage $V_{CAPd}$. As a result, the output bit Y<2> is set high or low, the voltage $V_{CAPd}$ is adjusted up or down, and the FSM 301 advances to the next state ("0010" here).

The cycle is then repeated for the bit "1" circuitry in substantially the same manner as is described above for the bit "2" circuitry, setting the output bit Y<1> high or low, adjusting the voltage $V_{CAPd}$ up or down, and advancing the FSM 301 to the next state ("0001" here). The cycle is then repeated once again for the bit "0" circuitry in substantially the same manner as is described above for the bit "2" and bit "1" circuitry, setting the output bit Y<0> high or low, and advancing the FSM to the next state ("0000" here). The analog-to-digital sampling and conversion are complete at this time, with the 4-bit result latched in the output generation circuit 302 and available at the outputs Y<3-0>.

Figure 4:
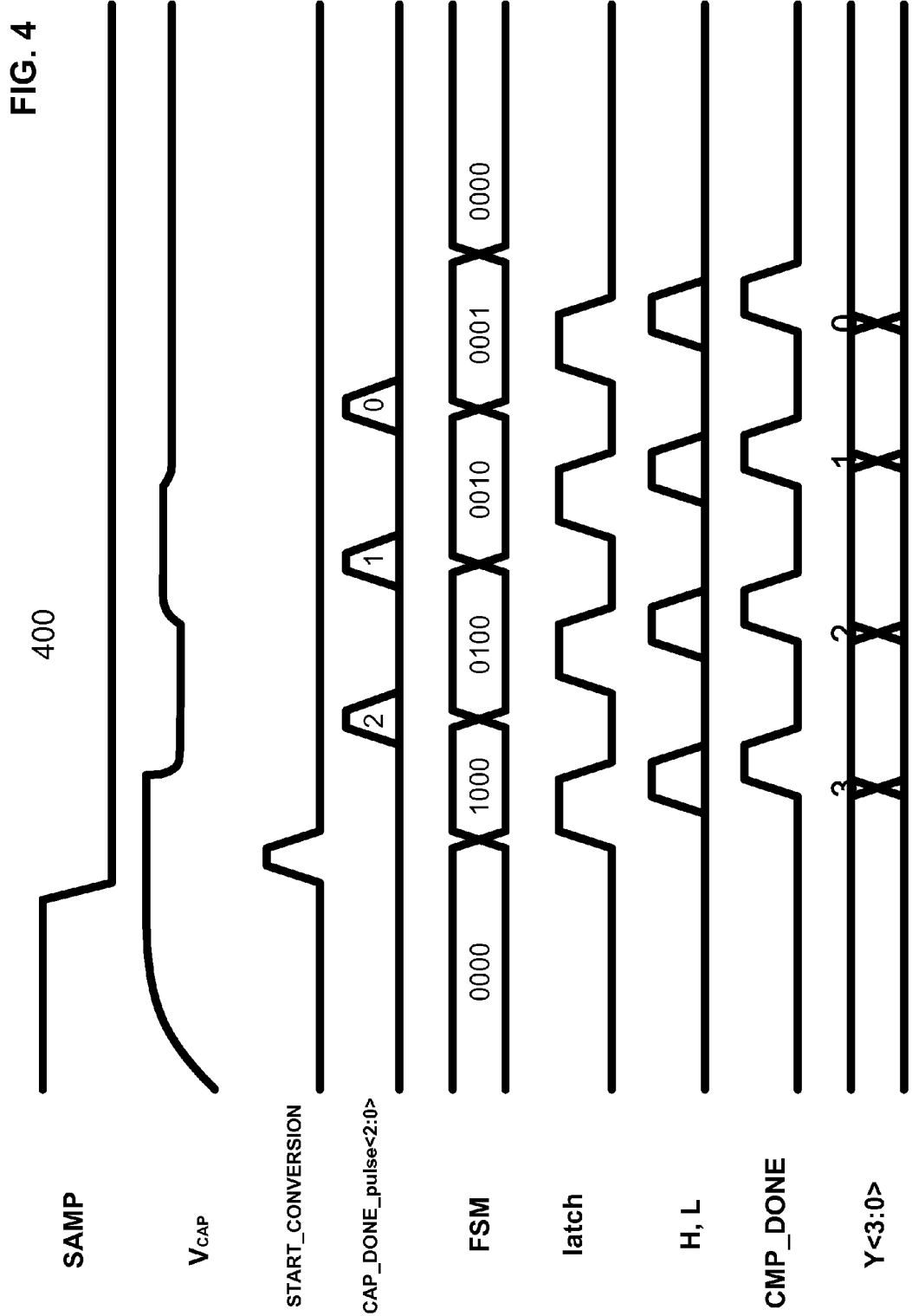
FIG. 4 illustrates selected aspects of waveforms of the ADC of FIGS. 3A-3D during sampling and conversion phases.

FIG. 4 shows, in a simplified way, selected waveforms 400 of the ADC 300 during the sampling and conversion phases.

Figure 5:
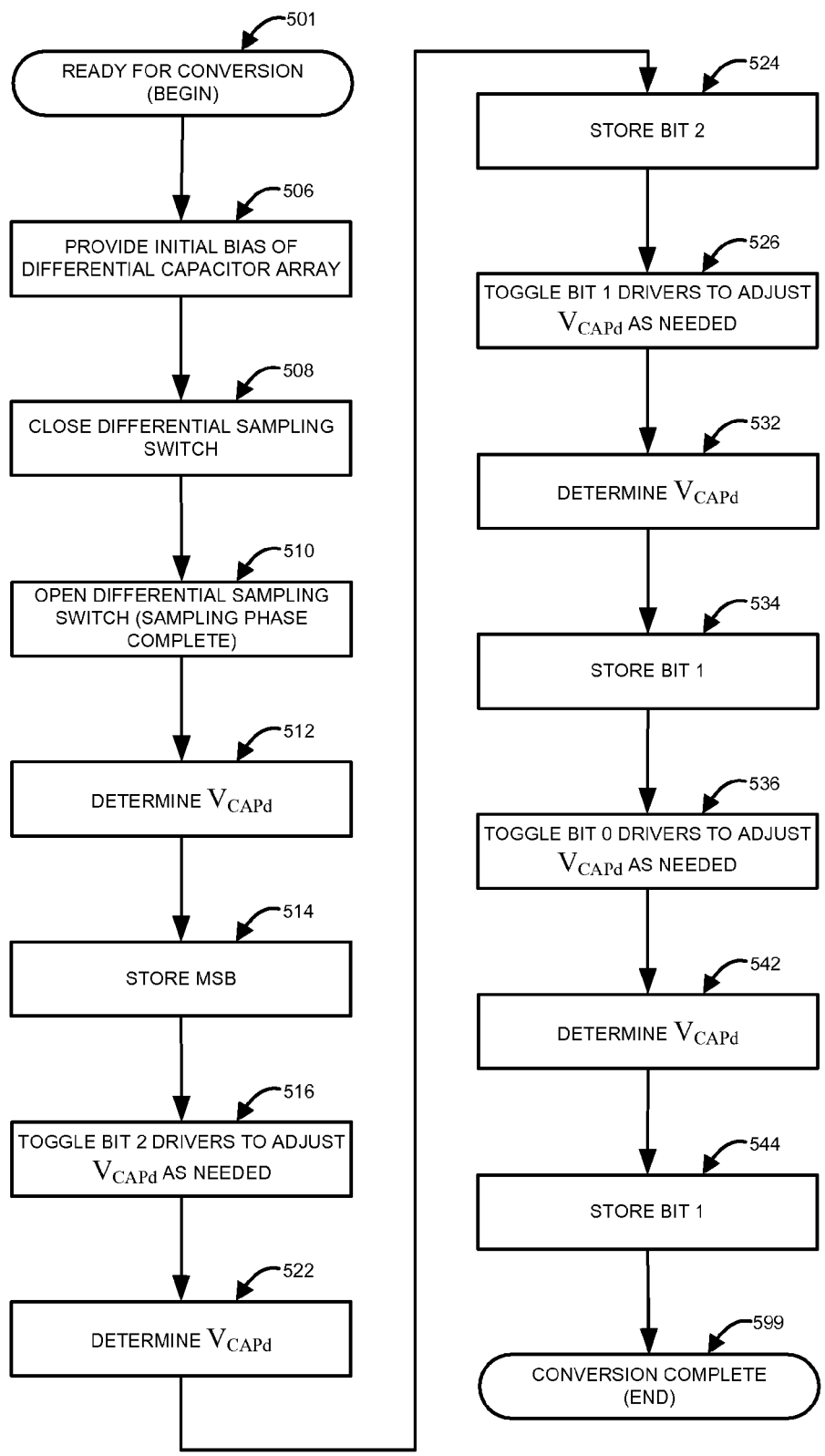
FIG. 5 illustrates selected steps of another successive approximation digital-to-analog conversion method.

FIG. 5 illustrates selected steps of a successive approximation digital-to-analog differential conversion method 500 performed by the ADC of FIGS. 3A-3D, beginning with flow point 501 where the ADC is ready to perform an analog-to-digital conversion.

In the sampling phase of the method 500, in step 506, the circuitry controlling the drivers/inverters that drive the differential binary capacitor array is configured so that: (1) each capacitor in a first binary set of capacitors in the array is coupled between the negative input differential node 342N and $V_{REFN}$, (2) each capacitor in a second binary set of capacitors in the array is coupled between the negative input differential node 342N and $V_{REFP}$, (3) each capacitor in a third binary set of capacitors in the array is coupled between the positive input differential node 342P and $V_{REFN}$, and (4) each capacitor in a fourth binary set of capacitors in the array is coupled between the positive input differential node 342P and $V_{REFP}$. With reference to FIG. 3, the first set may include $C_{B2}$, $C2_{B2}$, and $C4_{B2}$; the second set may include $C_{B1}$, $C2_{B1}$, and $C4_{B1}$; the third set may include $C_{T1}$, $C2_{T1}$, and $C4_{T1}$; and the fourth set may include $C_{T2}$, $C2_{T2}$, and $C4_{T2}$.

In step 508, the differential sampling switch 340 is closed to charge the capacitors $C_{T1}$, $C_{T2}$, $C_{B1}$, $C_{B2}$, $C2_{T1}$, $C2_{T2}$, $C2_{B1}$, $C2_{B2}$, $C4_{T1}$, $C4_{T2}$, $C4_{B1}$, and $C4_{B2}$ by the $V_{in}$ voltage appearing between the positive and negative input differential nodes 342P and 342N.

In step 510, the differential sampling switch 340 is opened, completing the sampling phase.

In the conversion phase the following events take place. In step 512, the 1-bit differential quantizer circuit 303 determines if $V_{CAPd}$ is greater or less than a threshold. The result of the comparison of $V_{CAPd}$ to the threshold is the MSB (bit 3) of the output word. In embodiments (such as the one shown in FIGS. 3), the ADC detects presence of valid data at the outputs of the quantizer, and asynchronously concludes the step of determining the $V_{CAPd}$ voltage when valid data is detected, but not earlier. As was discussed above, this avoids the need to wait the time necessary to exit the metastable state regardless of whether the metastable state in fact occurs.

The ADC stores the MSB, in step 514. In step 516, the ADC changes (toggles) the circuitry controlling the drivers/inverters so that either (1) one end of $C4_{T1}$ is no longer coupled to $V_{REFN}$ and instead is coupled to $V_{REFP}$, and one end of $C4_{B1}$ is no longer coupled to $V_{REFP}$ and instead is coupled to $V_{REFN}$, or (2) one end of $C4_{T2}$ is no longer coupled to $V_{REFP}$ and instead is coupled to $V_{REFN}$, and one end of $C4_{B2}$ is no longer coupled to $V_{REFN}$ and instead is coupled to $V_{REFP}$. This step increases the $V_{CAPd}$ voltage if the comparator 310 output indicated in the step 512 that the voltage was less than the threshold, and decreases the $V_{CAPd}$ voltage if the comparator 310 output indicated in the step 512 that the voltage was greater than the threshold.

In step 522, the quantizer circuit 303 determines if $V_{CAPd}$ is now (i.e., after the toggling in the step 516) greater or less than the threshold. The result of the comparison of $V_{CAPd}$ to the threshold in this step is the next bit (bit 2) of the output word. The ADC stores the bit 2 in step 524, and in step 526 toggles the circuitry controlling the drivers/inverters so that either (1) one end of $C2_{T1}$ is no longer coupled to $V_{REFN}$ and instead is coupled to $V_{REFP}$, and one end of $C2_{B1}$ is no longer coupled to $V_{REFP}$ and instead is coupled to $V_{REFN}$; or (2) one end of $C2_{T2}$ is no longer coupled to $V_{REFP}$ and instead is coupled to $V_{REFN}$, and one end of $C2_{B2}$ is no longer coupled to $V_{REFN}$ and instead is coupled to $V_{REFP}$. The last step increases the $V_{CAPd}$ voltage if the comparator 310 output indicated in the step 522 that the voltage was less than the threshold, and decreases the $V_{CAPd}$ voltage if the comparator 310 output indicated in the step 522 that the voltage was greater than the threshold.

In step 532, the quantizer circuit 303 determines if $V_{CAPd}$ is now (after the toggling of the step 526) greater or less than the threshold. The result of the comparison of $V_{CAPd}$ to the threshold in this step is the next bit (bit 1) of the output word. The ADC stores the bit 1 in step 534, and in step 536 toggles the circuitry controlling the drivers/inverters so that either (1) one end of $C_{T1}$ is no longer coupled to $V_{REFN}$ and instead is coupled to $V_{REFP}$, and one end of $C_{B1}$ is no longer coupled to $V_{REFP}$ and instead is coupled to $V_{REFN}$; or (2) one end of $C_{T2}$ is no longer coupled to $V_{REFP}$ and instead is coupled to $V_{REFN}$, and one end of $C_{B2}$ is no longer coupled to $V_{REFN}$ and instead is coupled to $V_{REFP}$. The last step increases the $V_{CAPd}$ voltage if the comparator 310 output indicated in the step 532 that the voltage was less than the threshold, and decreases the $V_{CAPd}$ voltage if the comparator 310 output indicated in the step 532 that the voltage was greater than the threshold.

In step 542, the quantizer circuit 303 determines if $V_{CAPd}$ is now (after the toggling of the step 536) greater or less than the threshold. The result of the comparison of $V_{CAPd}$ to the threshold in this step is the LSB (bit 0) of the output word. The ADC stores the bit 0 in step 544, The method 500 terminates at flow point 599. Note that in typical operation the method would be repeated as the need to convert a differential voltage into digital form arises.

The apparatus and methods described in this document can be used in various electronic devices, including, for example, access terminals operating within a cellular radio network transporting voice and/or data packets between multiple access terminals of the network, or between the access terminal and devices connected to additional networks outside the access network. In particular, the apparatus and methods may be used as part of a sigma-delta modulator of the access terminal. The apparatus may be used as any general purpose analog-to-digital converter.

Although steps and decisions of various methods may be described serially in this disclosure, some of these steps and decisions may be performed by separate elements in conjunction or in parallel, asynchronously or synchronously, in a pipelined manner, or otherwise. There is no particular requirement that the steps and decisions be performed in the same order in which this description lists them, except where explicitly so indicated, otherwise made clear from the context, or inherently required. It should be noted, however, that in selected variants the steps and decisions are performed in the particular sequences described and/or shown in the accompanying Figures. Furthermore, not every illustrated step and decision may be required in every embodiment or variant, while some steps and decisions that have not been specifically illustrated may be desirable in some embodiments/variants.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill in the art would further appreciate that the various illustrative logical blocks, modules, circuits, and algorithm steps described in connection with the embodiments disclosed herein may be implemented as electronic hardware, computer software, or combinations of both. To show clearly this interchangeability of hardware and software, various illustrative components, blocks, modules, circuits, and steps may have been described above generally in terms of their functionality. Whether such functionality is implemented as hardware, software, or combination of hardware and software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g. a combination of a DSP and a microprocessor, a plurality of microprocessors, one or more microprocessors in conjunction with a DSP core, or any other such configuration.

The steps of a method or algorithm that may have been described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in an access terminal. Alternatively, the processor and the storage medium may reside as discrete components in an access terminal.

The previous description of the disclosed embodiments is provided to enable any person skilled in the art to make and use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the widest scope consistent with the principles and novel features disclosed herein.

What is claimed is:

1. An analog-to-digital converter comprising:
   a comparator comprising a comparator input and a comparator output;
   a control block comprising a control block input coupled to the comparator output;
   a plurality of pairs of capacitors, capacitance values of the pairs of capacitors forming a substantially binary progression, each pair of capacitors of the plurality of pairs of capacitors comprising a first capacitor and a second capacitor, each capacitor of the plurality of pairs of capacitors comprising a first end coupled to the comparator input and a second end; and
   a sampling switch comprising a switch input configured to receive an input voltage, a switch output coupled to the comparator input, and a control switch input, the sampling switch being configured to be closed and transmit the input voltage to the switch output, or to be open and to isolate the input voltage from the switch output, depending on state of the control switch input;
   wherein the control block is configured to:
      provide an initial bias to the plurality of pairs of capacitors so that the second ends of the first capacitors are coupled to a first reference voltage, and the second ends of the second capacitors are coupled to a second reference voltage, the second reference voltage being less than the first reference voltage,
      close and open the sampling switch to charge the first and second capacitors so that a voltage Vs at the comparator input is substantially equal to the input voltage at the time the sampling switch is opened,
      cause the comparator to compare the voltage Vs to a predetermined comparator threshold Vt to obtain a first bit of an output word corresponding to a digital representation of the voltage Vs, and
      for said each pair of capacitors in sequence of decreasing capacitance values, (1) if last obtained bit of the word indicated that the voltage Vs is greater than the predetermined comparator threshold Vt (Vs>Vt), toggle from a first reference voltage to a second reference voltage the second end of the first capacitor of said each pair of capacitors in sequence, or, if the last obtained bit of the word indicated that Vt>Vs, toggle from the second reference voltage to the first reference voltage the second end of the second capacitor of said each pair of capacitors in sequence, and (2) after toggling, cause the comparator to compare the voltage Vs to the predetermined comparator threshold Vt to obtain a following bit of the word.

2. The analog-to-digital converter of claim 1, further comprising:
   a plurality of pairs of drivers, each pair of drivers comprising a first driver and a second driver, said each pair of drivers corresponding to a different pair of capacitors of the plurality of pairs of capacitors, the first driver of said each pair of drivers comprising an input controlled by the control block and an output coupled to the second end of the first capacitor of the pair of capacitors corresponding to said each pair of drivers, the second driver of said each pair of drivers comprising an input controlled by the control block and an output coupled to the second end of the second capacitor of the pair of capacitors corresponding to said each pair of drivers;
   wherein the control block is configured to provide the initial bias and toggle the second ends of the capacitors by controlling the inputs of the drivers.

3. The analog-to-digital converter of claim 2, wherein each driver of the plurality of pairs of drivers comprises an inverter.

4. The analog-to-digital converter of claim 3, further comprising a circuit for indicating when the comparator is not in a metastable state and the comparator provides a valid output.

5. The analog-to-digital converter of claim 3, further comprising a voltage follower having a voltage follower output coupled to the switch input.

6. The analog-to-digital converter of claim 3, wherein the sampling switch further comprises a voltage follower, the voltage follower being off when the sampling switch is open, the voltage follower being on when the sampling switch is closed.

7. A method of converting a voltage to a digital value, the method comprising steps of:
   providing a comparator comprising a comparator input and a comparator output;
   providing a plurality of pairs of capacitors, capacitance values of the pairs of capacitors forming a substantially binary progression, each pair of capacitors of the plurality of pairs of capacitors comprising a first capacitor and a second capacitor, each capacitor of the plurality of pairs of capacitors comprising a first end coupled to the comparator input and a second end;
   providing an initial bias to the plurality of pairs of capacitors so that the second ends of the first capacitors are coupled to a first reference voltage, and the second ends of the second capacitors are coupled to a second reference voltage, the second reference voltage being less than the first reference voltage;
   closing and opening a sampling switch to charge the first and second capacitors so that a voltage Vs at the comparator input is substantially equal to input voltage at input of the sampling switch when the sampling switch is opened;
   comparing the voltage Vs to a predetermined comparator threshold Vt to obtain a first bit of an output word corresponding to a digital representation of the voltage Vs; and after obtaining the first bit, for said each pair of capacitors in sequence of decreasing capacitance values, (1) if last obtained bit of the word indicated that the voltage Vs is greater than the predetermined comparator threshold Vt (Vs>Vt), toggling from a first reference voltage to a second reference voltage the second end of the first capacitor of said each pair of capacitors in sequence, or, if the last obtained bit of the word indicated that Vt>Vs, toggling from the second reference voltage to the first reference voltage the second end of the second capacitor of said each pair of capacitors in sequence, and (2) after toggling, comparing the voltage Vs to the predetermined comparator threshold Vt to obtain a following bit of the word.

8. The method of claim 7, further comprising providing a circuit for indicating when the comparator is not in a metastable state and the comparator provides a valid output.

9. The method of claim 7, further comprising providing the first and second reference voltages.

10. An analog-to-digital converter comprising:
means for quantizing comprising means for quantizing input and means for quantizing output;
means for controlling comprising means for controlling input coupled to the means for quantizing output;
a plurality of pairs of capacitors, capacitance values of the pairs of capacitors forming a substantially binary progression, each pair of capacitors of the plurality of pairs of capacitors comprising a first capacitor and a second capacitor, each capacitor of the plurality of pairs of capacitors comprising a first end coupled to the means for quantizing input and a second end; and
means for sampling comprising means for sampling input configured to receive an input voltage, means for sampling output coupled to the means for quantizing input, and a control input;
wherein the means for controlling is configured to:
provide an initial bias to the plurality of pairs of capacitors so that the second ends of the first capacitors are coupled to a first reference voltage, and the second ends of the second capacitors are coupled to a second reference voltage, the second reference voltage being less than the first reference voltage,
operate the means for sampling to charge the first and second capacitors so that a voltage Vs at the means for quantizing input is substantially equal to the input voltage at the time the means for sampling output enters a high impedance state,
cause the means for quantizing to quantize the voltage Vs to obtain a first bit of an output word corresponding to a digital representation of the voltage Vs, and
after obtaining the first bit, for said each pair of capacitors in sequence of decreasing capacitance values, (1) if last obtained bit of the word indicated that the voltage Vs is greater than a predetermined comparator threshold Vt (Vs>Vt), toggle from a first reference voltage to a second reference voltage the second end of the first capacitor of said each pair of capacitors in sequence, or, if the last obtained bit of the word indicated that Vt>Vs, toggle from the second reference voltage to the first reference voltage the second end of the second capacitor of said each pair of capacitors in sequence, and (2) after toggling, cause the means for quantizing to quantize the voltage Vs to obtain a following bit of the word.

11. An analog-to-digital converter comprising:
a comparator comprising first and second comparator inputs and a comparator output;
a control block comprising a control block input coupled to the comparator output;
a plurality of sets of capacitors, capacitance values of the sets of capacitors forming a substantially binary progression, each set of capacitors of the plurality of sets of capacitors comprising a first capacitor, a second capacitor, a third capacitor, and a fourth capacitor, each first and second capacitor of the plurality of sets of capacitors comprising a first end coupled to the first comparator input and a second end, each third and fourth capacitor of the plurality of sets of capacitors comprising a first end coupled to the second comparator input and a second end; and
a sampling switch comprising switch inputs configured to receive an input voltage difference, switch outputs coupled to the first and second comparator inputs, and a control switch input, the sampling switch being configured to be closed and transmit the input voltage difference to the switch outputs, or to be open and to provide high impedances at the switch outputs, depending on state of the control switch input;
wherein the control block is configured to:
provide an initial bias to the plurality of sets of capacitors so that the second ends of the first and fourth capacitors are coupled to a second reference voltage, and the second ends of the second and third capacitors are coupled to a first reference voltage, the second reference voltage being less than the first reference voltage,
close and open the sampling switch to charge the sets of capacitors so that a voltage difference Vs between the first and second comparator inputs is substantially equal to the input voltage difference at the time the sampling switch is opened,
compare the voltage difference Vs to a predetermined comparator threshold Vt to obtain a first bit of an output word corresponding to a digital representation of the voltage difference Vs, and
after obtaining the first bit, for said each set of capacitors in sequence of decreasing capacitance values, (1) if last obtained bit of the word indicated that the voltage difference Vs is greater than the predetermined comparator threshold Vt (Vs>Vt), toggle from a first reference voltage to a second reference voltage the second end of the second capacitor of said each set of capacitors in sequence and toggle from the second reference voltage to the first reference voltage the second end of the fourth capacitor of said each set of capacitors in sequence, (2) if the last obtained bit of the word indicated that Vt>Vs, toggle from the second reference voltage to the first reference voltage the second end of the first capacitors of said each set of capacitors in sequence and toggle from the first reference voltage to the second reference voltage the second end of the third capacitor of said each set of capacitors in sequence, and (3) after toggling, compare the voltage difference Vs to the predetermined comparator threshold Vt to obtain a following bit of the word.

12. The analog-to-digital converter of claim 11, further comprising:
a plurality of sets of drivers, each set of drivers comprising a first driver, a second driver, a third driver, and a fourth driver, said each set of drivers corresponding to a different set of capacitors of the plurality of sets of capacitors, the first driver of said each set of drivers comprising an input controlled by the control block and an output coupled to the second end of the first capacitor of the set of capacitors corresponding to said each set of drivers, the second driver of said each set of drivers comprising an input controlled by the control block and an output coupled to the second end of the second capacitor of the set of capacitors corresponding to said each set of drivers, the third driver of said each set of drivers comprising an input controlled by the control block and an output coupled to the second end of the third capacitor of the set of capacitors corresponding to said each set of drivers, and the fourth driver of said each set of drivers comprising an input controlled by the control block and an output coupled to the second end of the fourth capacitor of the set of capacitors corresponding to said each set of drivers;

wherein the control block is configured to provide the initial bias and toggle the second ends of the capacitors by controlling the inputs of the drivers.

13. The analog-to-digital converter of claim 12, wherein each driver of the plurality of sets of drivers comprises an inverter.

14. The analog-to-digital converter of claim 13, further comprising a differential voltage follower having first and second voltage follower outputs coupled to the switch inputs.

15. The analog-to-digital converter of claim 13, wherein the sampling switch further comprises a differential voltage follower, the differential voltage follower being off when the sampling switch is open, the differential voltage follower being on when the sampling switch is closed.

16. The analog-to-digital converter of claim 13, wherein the comparator includes a comparator, and a circuit configured to detect when the comparator is not in a metastable state and the comparator provides a valid output.

17. The analog-to-digital converter of claim 16, further comprising an asynchronous state machine configured to change states in response to the circuit detecting that the comparator is not in a metastable state and the comparator provides a valid output.

18. A method of converting a voltage to a digital value, the method comprising steps of:

providing a comparator comprising first and second comparator inputs and a comparator output;

providing a plurality of sets of capacitors, capacitance values of the sets of capacitors forming a substantially binary progression, each set of capacitors of the plurality of sets of capacitors comprising a first capacitor, a second capacitor, a third capacitor, and a fourth capacitor, each first and second capacitor of the plurality of sets of capacitors comprising a first end coupled to the first comparator input and a second end, each third and fourth capacitor of the plurality of sets of capacitors comprising a first end coupled to the second comparator input and a second end;

providing an initial bias to the plurality of sets of capacitors so that the second ends of the first and fourth capacitors are coupled to a second reference voltage, and the second ends of the second and third capacitors are coupled to a first reference voltage, the second reference voltage being less than the first reference voltage;

closing and opening a sampling switch to charge the sets of capacitors so that a voltage difference Vs between the first and second comparator inputs is substantially equal to an input voltage difference at inputs of the sampling switch when the sampling switch is opened;

comparing the voltage difference Vs to a predetermined comparator threshold Vt to obtain a first bit of an output word corresponding to a digital representation of the voltage difference Vs; and after obtaining the first bit, for said each set of capacitors in sequence of decreasing capacitance values, (1) if last obtained bit of the word indicated that the voltage difference Vs is greater than the predetermined comparator threshold Vt (Vs>Vt), toggling from a first reference voltage to a second reference voltage the second end of the second capacitor of said each set of capacitors in sequence and toggling from the first reference voltage to the second reference voltage the second end of the fourth capacitor of said each set of capacitors in sequence, (2) if the last obtained bit of the word indicated that Vt>Vs, toggling from the second reference voltage to the first reference voltage the second end of the first capacitor of said each set of capacitors in sequence and toggling from the first reference voltage to the second reference voltage the second end of the third capacitor of said each set of capacitors in sequence, and (3) after toggling, comparing the voltage difference Vs to the predetermined comparator threshold Vt to obtain a following bit of the word.

19. The method of claim 18, wherein the step of providing the comparator comprises providing a comparator and providing a circuit configured to detect when the comparator is not in a metastable state and the comparator output is valid.

20. The method of claim 18, wherein the steps of toggling are performed asynchronously in response to the circuit indicating that the comparator is not in the metastable state and the comparator output is valid.

21. The method of claim 18, further comprising providing the first and second reference voltages.

22. An analog-to-digital converter comprising:

means for quantizing a voltage comprising first and second comparator inputs and a comparator output;

means for controlling comprising means for controlling input coupled to the comparator output;

a plurality of sets of capacitors, capacitance values of the sets of capacitors forming a substantially binary progression, each set of capacitors of the plurality of sets of capacitors comprising a first capacitor, a second capacitor, a third capacitor, and a fourth capacitor, each first and second capacitor of the plurality of sets of capacitors comprising a first end coupled to the first comparator input and a second end, each third and fourth capacitor of the plurality of sets of capacitors comprising a first end coupled to the second comparator input and a second end; and means for sampling comprising means for sampling inputs configured to receive an input voltage difference, means for sampling outputs coupled to the first and second comparator inputs, and a means for sampling control input, the means for sampling being configured to be closed and transmit the input voltage difference to the means for sampling outputs, or to be open and to provide high impedances at the means for sampling outputs, depending on state of the means for sampling control input;

wherein the means for controlling is configured to:

provide an initial bias to the plurality of sets of capacitors so that the second ends of the first and fourth capacitors are coupled to a second reference voltage, and the second ends of the second and third capacitors are coupled to a first reference voltage, the second reference voltage being less than the first reference voltage, close and open the means for sampling to charge the sets of capacitors so that a voltage difference Vs between the first and second means for quantizing inputs is substantially equal to the input voltage difference at the time the means for sampling is opened, cause the means for quantizing to quantize the voltage difference Vs to obtain a first bit of an output word corresponding to a digital representation of the voltage difference Vs, and after obtaining the first bit, for said each set of capacitors in sequence of decreasing capacitance values, (1) if last obtained bit of the word indicated that the voltage difference Vs is greater than a predetermined comparator threshold Vt (Vs>Vt), toggle from a first reference voltage to a second reference voltage the second ends of the second and third capacitors of said each set of capacitors in sequence, or, if the last obtained bit of the word indicated that Vt>Vs, toggle from the second reference voltage to the first reference voltage the second ends of the second and third capacitors of said each set of capacitors in sequence, and (2) after toggling, cause the means for quantizing to quantize the voltage difference Vs to obtain a following bit of the word.

* * * * *